(12) United States Patent
Yun et al.

(10) Patent No.: US 6,286,117 B1
(45) Date of Patent: *Sep. 4, 2001

(54) CIRCUITS AND METHODS FOR TESTING LOGIC DEVICES BY MODULATING A TEST VOLTAGE WITH A NOISE SIGNAL

(75) Inventors: Sung-jun Yun; Ki-hun Jung; Yun-ki Kim; Hyun-deok Park, all of Kyungki-do (KR)

(73) Assignee: Samsung Electronics, Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/102,202

(22) Filed: Jun. 22, 1998

(30) Foreign Application Priority Data

Jun. 23, 1997 (KR) .................................................. 97-26474

(51) Int. Cl.[7] ........................................................ G01R 31/28
(52) U.S. Cl. ........................ 714/724; 714/734; 714/736; 324/73.1
(58) Field of Search ..................................... 714/724, 728, 714/731, 733–736, 32, 57; 324/73.1, 613; 702/122, 123, 120

(56) References Cited

U.S. PATENT DOCUMENTS

| 3,577,017 | * | 5/1971 | Duke et al. | 327/304 |
| 3,631,229 | | 12/1971 | Bens et al. | 714/734 |
| 3,764,995 | | 10/1973 | Helf, Jr. et al. | 714/321 |
| 4,070,565 | | 1/1978 | Borrelli | 714/734 |
| 4,553,049 | | 11/1985 | Cha et al. | 326/16 |
| 5,668,507 | | 9/1997 | Boerstler et al. | 331/78 |
| 5,737,342 | * | 4/1998 | Ziperovich | 714/736 |
| 5,914,827 | * | 6/1999 | Yamasaki et al. | 360/27 |
| 5,966,645 | * | 10/1999 | Davis | 455/108 |

* cited by examiner

Primary Examiner—Emmanuel L. Moise
(74) Attorney, Agent, or Firm—Myers Bigel Sibley & Sajovec

(57) ABSTRACT

Noise is introduced into test inputs and voltage supplies provided to logic devices while under going testing by modulating a test voltage output with a noise signal to produce the test input. In particular, a noise signal and a test voltage output are generated. The test voltage output is modulated with the noise signal to provide a test input to the logic device. A more accurate approximation of an actual operating environment is thereby provided.

27 Claims, 4 Drawing Sheets

CIRCUITS AND METHODS FOR TESTING LOGIC DEVICES BY MODULATING A TEST VOLTAGE WITH A NOISE SIGNAL

FIELD OF THE INVENTION

The present invention relates to the field of electronics in general and to electronics testing in particular.

BACKGROUND OF THE INVENTION

Logic devices may operate according to logical inputs and voltage supplies provided to the logic devices. The logic devices may be subjected to noise and variations in power levels as a result of the electrical characteristics of the system in which the logic devices operate.

Logic devices may be tested as stand-alone devices or in groups that estimate the electrical characteristics of the system in which the logic devices operate. In general, conventional testing systems may provide test inputs and a voltage supply to the logic devices and examine the resulting outputs generated by the logic devices in response to the test inputs. For example, test inputs may include patterns of signal levels that generate a corresponding response from the logic devices. If the logic devices are functioning properly, the response corresponds to the test inputs. The logic devices may, thereby, be accepted or rejected based on the response of the logic devices when subjected to the test inputs and voltage supply.

Conventional testing systems may provide the test inputs and voltage supply described above during a particular phase of the test procedure. For example, the testing system may provide the test inputs and voltage supply during a first testing phase. When the first testing phase ends, the system may provide new test inputs and voltage supply corresponding to a second phase of testing. As the performance and complexity of logic devices increase, there is an increasing need for improved testing of logic devices.

SUMMARY OF THE INVENTION

In view of the above discussion, it is an object of the present invention to provide improved testing of logic devices.

It is another object of the present invention to provide improved noise testing of logic devices.

These and other objects of the present invention are provided by circuits, methods, and systems that introduce noise into test inputs and voltage supplies provided to the logic devices while under going testing by modulating a test voltage output with a noise signal to produce the test input. In particular, a noise signal and a test voltage output are generated. The test voltage output is modulated with the noise signal to provide a test input to the logic device. The present invention may thereby provide a test input that may allow a more accurate representation of a system having noise, by approximating an actual operating environment for the logic device under going testing.

The noise generator can produce an analog signal or a clock signal to be used as the noise component of the test input. For example, the noise generator can provide a clock signal that is combined, via the modulator, with the test voltage output to produce an approximation of switching noise in the test input to the logic device. The noise signal can include a pseudo-random noise signal or a periodic signal.

In one aspect, the noise generator is a clock signal generator that produces a clock signal having a clock signal amplitude and a clock signal frequency. The present invention may thereby provide a noise component of the test input having an amplitude and a frequency that can be controlled. The noise generator can also produce a noise signal having a variable frequency and amplitude. The present invention may thereby allow a more accurate representation of the noise found in actual systems using the logic devices under going testing.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices.

Figure 1:
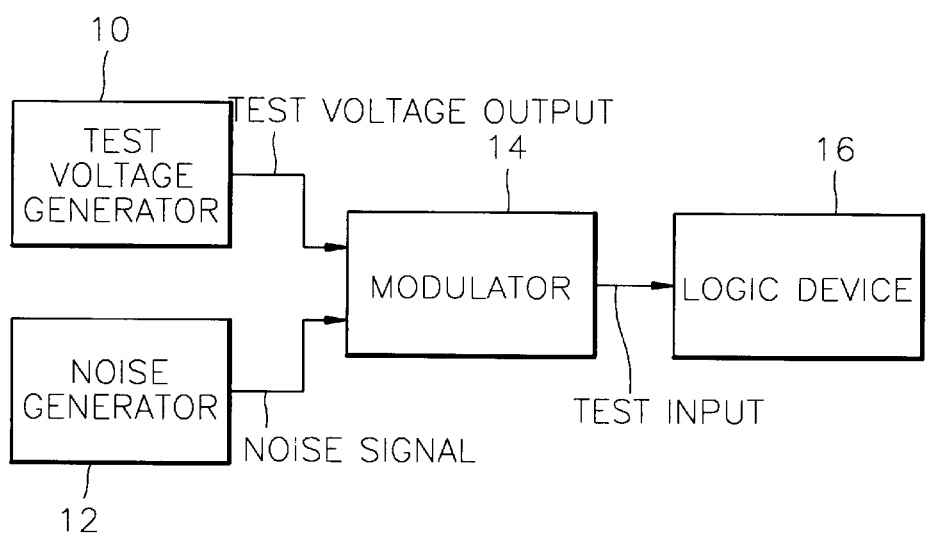
FIG. 1 is a block diagram illustrating testing systems and methods according to the present invention.

FIG. 1 is a block diagram illustrating testing systems and methods according to the present invention. A test voltage generator 10 produces a test voltage output that corresponds to a test input or voltage supply provided to logic device 16. For example, the test voltage output may be an input voltage or voltage supply for a Complementary Metal Oxide Semiconductor (CMOS) device. The test voltage generator 10 can be a variable test voltage generator that produces a variable test voltage output. For example, the test voltage generator 10 may produce a test voltage output that corresponds to a logical "0" and a test voltage output that corresponds to a logical "1". The test voltage generator 10 may vary the frequency of the test voltage output. For example, the test voltage output may be a digital pulse train to approximate a stream of logical 1's and 0's as the test inputs to the logic device 16.

A noise generator 12 produces a noise signal that is provided to a modulator 14. The noise signal preferably is a pseudo-random or periodic noise signal. In one embodiment, the periodic noise signal has a period of about 200 nanoseconds (ns) and the periodic noise signal has an amplitude in the range between about 1 volt and 2 volts. The noise generator 12 can be a clock signal generator that produces a clock signal having a clock signal frequency and a clock signal amplitude. The clock signal generator can be a variable clock signal generator that produces a variable clock signal amplitude and a variable clock signal frequency. The noise generator 12 can also be an analog signal generator for generating an analog signal having an amplitude and frequency. The analog signal generator can be a variable analog signal generator that produces a variable noise signal amplitude and a variable noise signal frequency.

The modulator 14 is responsive to the test voltage generator 10 and the noise generator 12. The modulator 14 combines the test voltage output produced by the voltage generator 10 with the noise signal produced by the noise generator 12 to produce the test input for logic device 16.

The logic device 16 is an electronic device, such as a digital logic device or an analog device. The logic device 16 can be a single electronic device or a group of electronic devices. The logic device 16 operates under test in response to the test input. The test input can be a logical input or a voltage supply including noise as described above.

Figure 2:
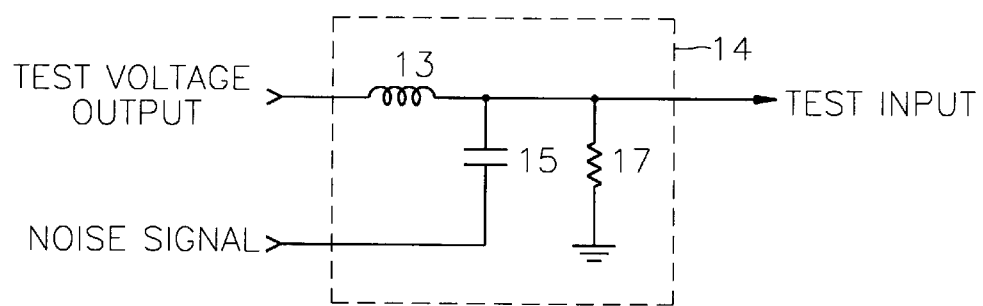
FIG. 2 is an embodiment of a modulator according to the present invention.

The modulator 14 will now be described in greater detail. FIG. 2 is an embodiment of a modulator 14 according to the present invention. The modulator 14 combines the test voltage output with the noise signal to produce the test input. The modulator 14 includes an inductor 13, a capacitor 15 and a resistor 17. The inductor 13 is responsive to the test voltage generator 10 and receives the test voltage output. Inductor 13 produces a portion of the test input from the test voltage output produced by the test voltage generator 10. The capacitor 15 is responsive to the noise generator 12 and receives the noise signal. The capacitor 15 couples the noise signal produced by the noise generator 12 to the test input, thereby introducing noise into the test input. The resistor 17 provides impedance matching between the logic device 16 and the modulator 14. The combined outputs of the inductor 13 and the capacitor 15 produce a modulated version of the test voltage output produced by the test voltage generator 10. In other words, the test voltage output and the noise signal are combined through the inductor 13 and capacitor 15, respectively, to produce the test input. The test input is provided to the logic device 16 as a logical input or as a voltage supply. The amplitude and frequency of the test input provided to logic device 16 can be varied by changing the value of inductor 13 and capacitor 15. For example, the amplitude and frequency of the test voltage output can be varied by changing the value of the inductor 13. The amplitude and frequency of the noise signal can be varied by changing the value of the capacitor 15.

Figure 3:
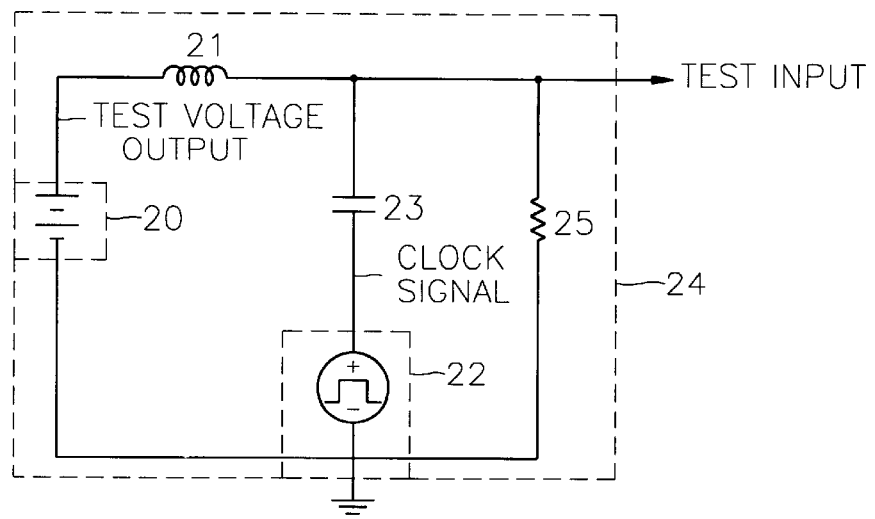
FIG. 3 is an embodiment of testing systems and methods according to the present invention.

FIG. 3 is an embodiment of a testing system 24 according to the present invention. A test voltage generator 20 produces a test voltage output that is provided to an inductor 21. The test voltage generator 20 may be a battery or test board that provides a programmable voltage level to a pin of a logic device. The test voltage output is provided to the test input via inductor 21. The test voltage output may be varied by varying the output of the test voltage generator 20. The noise generator 22 is a clock signal generator that produces a periodic noise signal having a clock signal frequency and a clock signal amplitude. The periodic noise signal provided by the clock signal generator is provided to the test input via capacitor 23. The resistor 25 provides impedance matching between the logic device undergoing testing and the testing system 24.

Figure 4:
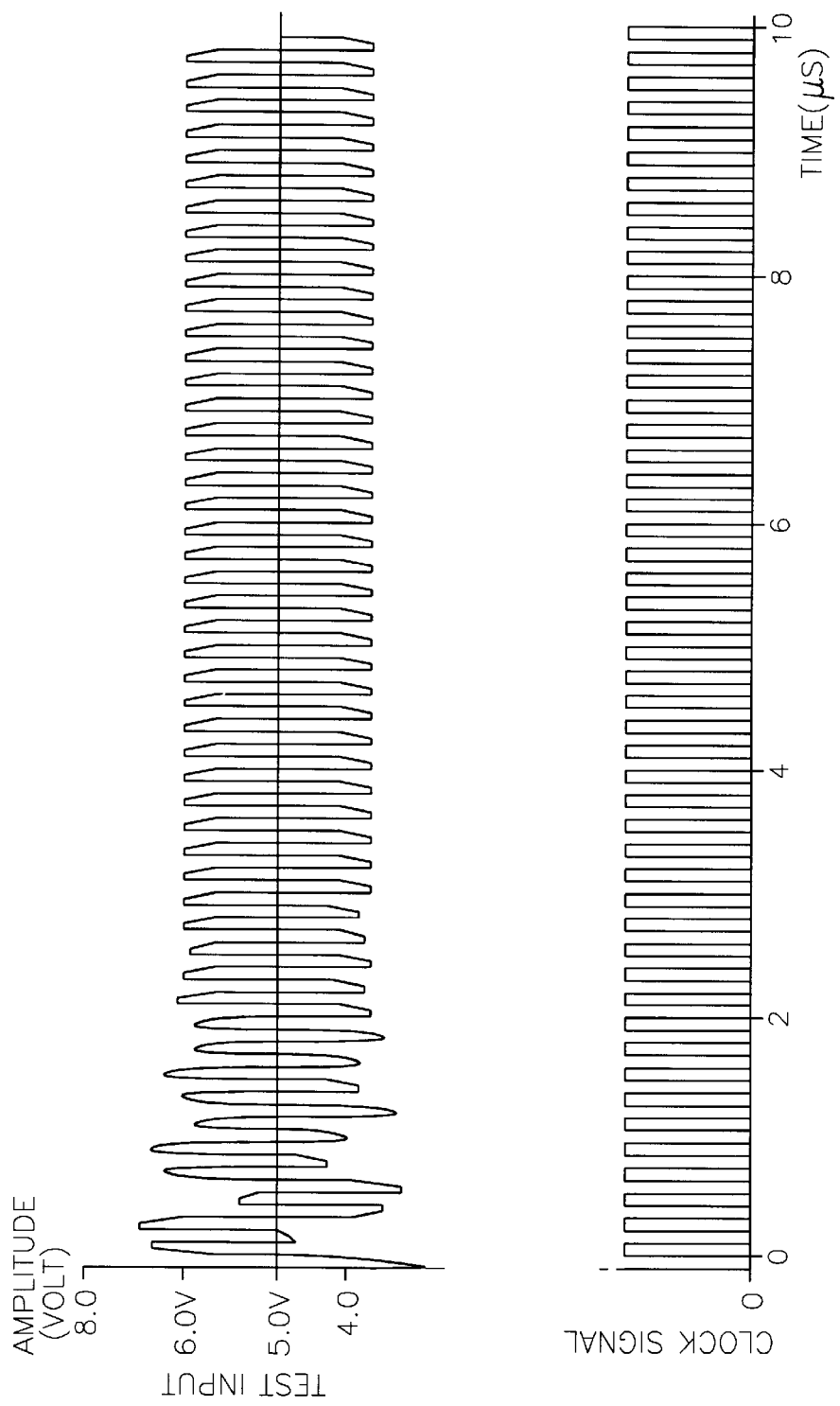
FIG. 4 is a graph illustrating a test input and clock signal according to FIG. 3.

FIG. 4 is a graph illustrating a test input and clock signal according to FIG. 3. The test input is provided by the combination of a test voltage output of about 5.0 volts and a clock signal provided by the clock signal generator 22. The test input thereby approximates a logical input or voltage supply to the device under going testing. In contrast, conventional testing systems may provide a test input without a noise component. Consequently, conventional testing systems may not approximate an actual operating environment.

The amplitude of the noise component of the test input may be varied by changing the amplitude of the clock signal. For example, the amplitude of the noise component of the test input may be increased by increasing the amplitude of the clock signal. Alternately, the amplitude of the noise component of the test input may be reduced by reducing the amplitude of the clock signal. The frequency of the noise component of the test input may be varied by changing the frequency of the clock signal. The frequency and amplitude of the noise component in the test input may be varied by varying the value of the capacitor 23. For example, the frequency of the noise component of the test input may be increased by increasing the frequency of the clock signal. Similarly, the frequency of the noise component of the test input may be decreased by decreasing the frequency of the clock signal.

In a preferred embodiment, the noise generator 22 generates a clock signal having an amplitude of about 2 volts and a period of about 200 nanoseconds as shown in FIG. 4. A test input having an amplitude of 4 to 6 volts is produced using a value of about 1000 nanohenrys (nH) for inductor 21 and a value of about 10 nanoFarads (nF) for capacitor 23 and a value of about 50 ohms for resistor 25.

Figure 5:
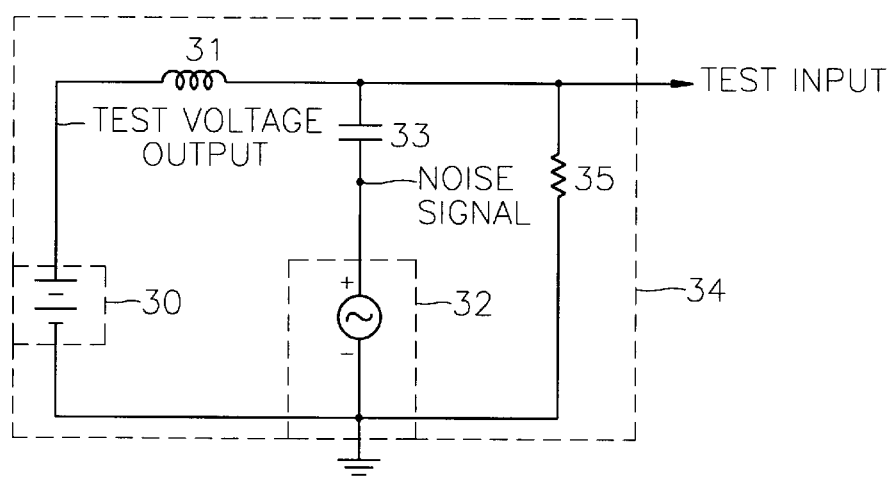
FIG. 5 is another embodiment of testing systems and methods according to the present invention.

FIG. 5 is another embodiment of a testing system 34 according to the present invention. Test voltage generator 30 produces a test voltage output that is provided to inductor 31. The test voltage generator 30 may be a battery or test board that provides a programmable voltage level to a pin of a logic device. The test voltage output produced by the test voltage generator 30 may be varied to represent transitions on the logical inputs provided to the logic device. Inductor 31 is responsive to the test voltage generator 30 and provides the test voltage output to the test input.

The noise generator 32 produces a noise signal that is provided to the capacitor 33. The noise generator 32 produces a noise signal that varies in amplitude and frequency over time. The noise generator 32 thereby introduces a noise component into the test input via capacitor 33. Consequently, the test voltage output (via inductor 31) and the noise signal (via capacitor 33) are combined to produce the test input to the logic device under going testing.

Figure 6:
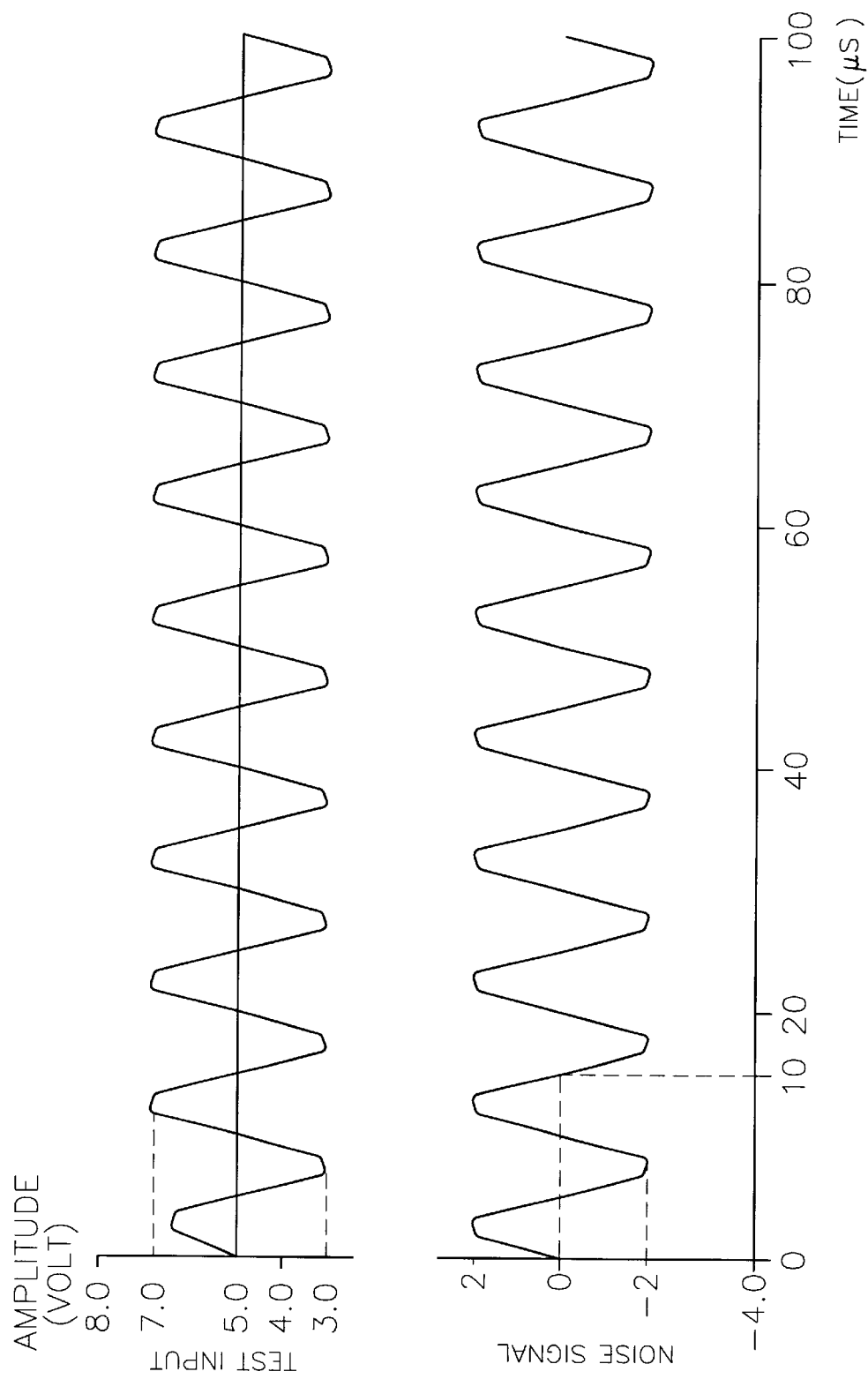
FIG. 6 is a graph illustrating a test input and noise signal according to FIG. 5.

FIG. 6 is a graph illustrating a test input and the noise signal according to FIG. 5. The test input is provided by the test voltage output generated by the test generator 30 in combination with the noise component produced by the noise generator 32. The component of the test input provided by the test voltage output (via inductor 31) can be controlled by varying the value of inductor 31. The amplitude and frequency of the test input may thereby be varied by changing the value of inductor 31. The amplitude and frequency of the noise component of the test input may be controlled by controlling the value of the capacitor 33.

The amplitude of the noise component of the test input may be varied by changing the amplitude of the noise signal. For example, the amplitude of the noise component of the test input may be increased by increasing the amplitude of the noise signal. Alternately, the amplitude of the noise component of the test input may be reduced by reducing the amplitude of the noise signal. The amplitude of the noise signal can be varied by varying the value of the capacitor 33. The frequency of the noise component of the test input may be varied by varying the frequency of the noise signal. The frequency of the noise component in the test input may be varied by varying the value of the capacitor 33. For example, the frequency of the noise component of the test input may be increased by increasing the frequency of the noise signal.

Similarly, the frequency of the noise component of the test input may be decreased by decreasing the frequency of the noise signal.

In a preferred embodiment, the noise generator 32 generates a noise signal having a peak-to-peak amplitude of about 4 volts and a period of about 10 μs. A test input having an amplitude of about 3 to 7 volts is produced using a value of about 1 mH for inductor 31 and a value of about 100 nF for capacitor 33 and a value of about 50 ohms for resistor 35.

The present invention may allow the introduction of noise into test inputs and voltage supplies provided to logic devices while under going testing by modulating a test voltage output with a noise signal to produce the test input. In particular, a noise signal and a test voltage output are generated. The test voltage output is modulated with the noise signal to provide a test input to the logic device. The present invention may thereby provide a more accurate test of the logic device when operating in a system having noise.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A circuit that provides a test input to a logic device, wherein the logic device functions in response to the test input provided to the logic device while under testing, the circuit comprising:

a test voltage generator that produces a test voltage output;

a noise generator that produces a noise signal; and an analog modulator, responsive to the test voltage generator and the noise generator, that modulates the test voltage output with the noise signal to produce the test input.

2. The circuit of claim 1, wherein said noise generator is a periodic noise generator that produces a periodic noise signal.

3. The circuit of claim 1, wherein the test voltage generator is a variable test voltage generator that produces a variable test voltage output.

4. The circuit of claim 1, wherein said noise generator comprises a clock signal generator that produces a clock signal having a clock signal frequency and a clock signal amplitude.

5. The circuit of claim 4, wherein said clock signal generator comprises a variable clock signal generator that produces a variable clock signal frequency and a variable clock signal amplitude.

6. The circuit of claim 1, wherein the noise signal has a period in the range between about 200 ns and 10 μsec and an amplitude in the range between about 1 volt and 4 volts.

7. A circuit that provides a test input to a logic device, wherein the logic device functions in response to the test input provided to the logic device while under testing, the circuit comprising:

a test voltage generator that produces a test voltage output;

a noise generator that produces a noise signal;

an analog modulator, responsive to the test voltage generator and the noise generator, that modulates the test voltage output with the noise signal to produce the test input; and wherein said analog modulator comprises:

an inductor, responsive to said test voltage generator;

a capacitor, responsive to said noise generator; and a resistor that provides impedance matching between the logic device and said analog modulator, wherein the inductor, the capacitor, and the resistor are connected to a common node at an output of the analog modulator to provide the test input signal.

8. A method of generating a test input, wherein the test input is provided to a logic device that functions in response to the test input provided to the logic device while under testing, the method comprising the steps of:

generating a test voltage output;

generating a noise signal; and combining the test voltage output with the noise signal to produce the test input, using an analog modulator.

9. The method of claim 8, wherein said step of generating a noise signal comprises the step of generating a periodic noise signal.

10. The method of claim 8, wherein said step of generating a test voltage output comprises the step of generating a variable test voltage output.

11. The method of claim 8, wherein said step of generating a noise signal comprises the step of generating a clock signal having a clock signal frequency and a clock signal amplitude.

12. The method of claim 11, wherein said step of generating a clock signal having a clock signal frequency and a clock signal amplitude comprises the step of generating a clock signal having a variable clock signal frequency and a variable clock signal amplitude.

13. The method of claim 8, wherein said step of combining comprises the step of modulating the test voltage output with the noise signal to produce the test input.

14. The method of claim 8, wherein the step of generating a noise signal comprises the step of generating a noise signal having a period in the range between about 200 ns and 10 μsec and having an amplitude in the range between about 1 volt and 4 volts.

15. A system that provides a test input to a logic device, wherein the logic device functions in response to the test input provided to the logic device while under testing, the system comprising:

means for generating a test voltage output;

means for generating a noise signal; and means, responsive to said means for generating a test voltage output and said means for generating a noise signal, for combining the test voltage output with the noise signal to produce the test input using an analog modulator.

16. The system of claim 15, wherein said means for generating a noise signal comprises means for generating a periodic noise signal.

17. The system of claim 16, wherein said means for generating a periodic noise signal comprises means for generating a periodic noise signal having a period in the range between about 200 ns and 10 μsec and having an amplitude in the range between about 1 volt and 4 volts.

18. The system of claim 15 in combination with a logic device, wherein the test input is connected to the logic device.

19. The system of claim 15, wherein said means for generating a test voltage output comprises means for generating a variable test voltage output.

20. The system of claim 15, wherein said means for generating a noise signal comprises means for generating a clock signal having a clock signal frequency and a clock signal amplitude.

21. The system of claim 20, wherein said means for generating a clock signal comprises means for generating a variable clock signal frequency and a variable clock signal amplitude.

22. The system of claim 15, wherein said means for combining comprises means for modulating the test voltage output with the noise signal to produce the test input.

23. A circuit that provides a power supply test input to a logic device, wherein the logic device functions in response to the power supply test input provided to the logic device while under testing, the circuit comprising:

a power supply test voltage generator that produces a power supply test voltage output;

a power supply noise generator that produces a power supply noise signal; and an analog modulator, responsive to the power supply test voltage generator and the power supply noise generator, that modulates the power supply test voltage output with the power supply noise signal to produce the power supply test input.

24. A system that provides a test input to a logic device, wherein the logic device functions in response to the test input provided to the logic device while under testing, the system comprising:

means for generating a test voltage output;

means for generating a noise signal; and means for analog combining the test voltage output with the noise signal to produce the test input, responsive to said means for generating a test voltage output and said means for generating a noise signal, wherein the means for analog combining comprises:

inductive means, responsive to said means for generating a test voltage output;

capacitive means, responsive to said means for generating a noise signal; and resistive means for providing impedance matching between the logic device and said means for analog combining, wherein the inductive means, the capacitive means, and the resistive means are connected to a common node at an output of the means for analog combining to provide the test input.

25. A circuit that provides a power supply test input to a logic device, wherein the logic device functions in response to the power supply test input provided to the logic device while under testing, the circuit comprising:

a power supply test voltage generator that produces a power supply test voltage output;

a power supply noise generator that produces a power supply noise signal;

an analog modulator, responsive to the power supply test voltage generator and the power supply noise generator, that modulates the power supply test voltage output with the power supply noise signal to produce the power supply test input; and wherein the analog modulator comprises:

an inductor, responsive to said power supply test voltage generator generator;

a capacitor, responsive to said power supply noise generator, and a resistor that provides impedance matching between the logic device and said modulator, wherein the inductor, the capacitor, and the resistor are connected to a common node at an output of the analog modulator to provide the power supply test input.

26. A circuit external to an integrated circuit logic device that provides a test input to the integrated circuit logic device, wherein the integrated circuit logic device functions in response to the test input provided to the logic device while under testing, the circuit comprising:

a test voltage generator, external to the integrated circuit logic device, that produces a test voltage output;

a noise generator, external to the integrated circuit logic device, that produces a noise signal; and an analog modulator, external to the integrated circuit logic device, responsive to the test voltage generator and the noise generator, that modulates the test voltage output with the noise signal to produce the test input.

27. A method of generating a test input that is provided to an integrated circuit logic device that functions in response to the test input provided to the integrated circuit logic device while under testing, the method comprising the steps of:

generating a test voltage output external to the integrated circuit logic device;

generating a noise signal external to the integrated circuit logic device; and combining the test voltage output with the noise signal to produce the test input, using an analog modulator that is external to the integrated circuit logic device.

* * * * *